United States Patent [19]
Biagetti et al.

[11] Patent Number: 4,952,862
[45] Date of Patent: Aug. 28, 1990

[54] APPARATUS AND METHOD FOR ADAPTIVELY PREDICTING BATTERY DISCHARGE RESERVE TIME

[75] Inventors: Richard V. Biagetti, Piscataway, N.J.; Anthony M. Pesco, Cedarhurst, N.Y.

[73] Assignee: AT&T Bell Laboratories, Murray Hill, N.J.

[21] Appl. No.: 414,890

[22] Filed: Sep. 29, 1989

[51] Int. Cl.⁵ .................. G01N 27/46; H01M 10/48
[52] U.S. Cl. ........................................ 320/48; 324/427
[58] Field of Search ............... 320/43, 44, 48, 13, 320/37; 324/427

[56] References Cited

U.S. PATENT DOCUMENTS

| | | | |
|---|---|---|---|
| 3,886,442 | 3/1975 | Chiku et al. | 320/48 X |
| 4,380,726 | 4/1983 | Sado et al. | 320/37 X |
| 4,433,278 | 2/1984 | Lowndes et al. | 320/48 |
| 4,558,281 | 12/1985 | Codd et al. | 324/427 X |
| 4,595,880 | 6/1986 | Patil | 324/427 |
| 4,876,513 | 10/1989 | Brilmyer et al. | 324/427 |

*Primary Examiner*—R. J. Hickey
*Attorney, Agent, or Firm*—Alford G. Steinmetz

[57] ABSTRACT

A reliable technique of predicting the available reserve time remaining to a selected end voltage of a discharging battery is based on an adaptive state-of-charge algorithm that is active in real time to respond to changing conditions of a battery system. The adaptive state-of-charge algorithm is based on measured discharge characteristics of the battery whose reserve time is to be predicted which have been reduced to two parameters plotted as a single curve with a linear and an exponential region. These discharge characteristics are combined with dynamic parameters of the battery system which are monitored and processed in real time to provide a continuous evaluation and reevaluation of the reserve time remaining under changing conditions. As the discharge proceeds there is a continual improvement in the prediction of reserve time available.

This predictive feature embodying the principles of the invention is included in a stored program controller for a battery plant in a central office in the illustrative embodiment of the invention disclosed herein. In such applications it is highly desirable to be able to predict the available reserve time of a discharging battery until a final end voltage level is reached.

19 Claims, 7 Drawing Sheets

APPARATUS AND METHOD FOR ADAPTIVELY PREDICTING BATTERY DISCHARGE RESERVE TIME

FIELD OF THE INVENTION

This invention relates to apparatus and a method to predict the discharge capacity of a battery by predicting the reserve time remaining in a discharging battery to a specified end-voltage and, in particular, to an adaptive reserve time prediction system that is active in real time to respond to changing conditions of a discharging battery.

BACKGROUND OF THE INVENTION

One process of determining the capacity of a discharging battery is based on the ampere hour capacity of the battery; that is the number of hours that the battery can supply a given current, assuming a constant current, or supply a given ampere hour area if the current varies. Capacity evaluation is based on current because it is a reliable indication of the ability of the battery to power a load. The discharge of the battery is generally considered complete when the battery voltage drops to some voltage level which is a bare minimum requirement of the load network. Typical discharge characteristics of new batteries are shown in FIG. 1 in which discharge curves relating battery voltage and time are shown for various constant value discharge currents. It is readily apparent that the value of the discharge current significantly affects the time of discharge until a particular battery discharge voltage is reached. These discharge curves characteristically reflect the capacity of the battery when these measurements were made and would not necessarily reflect true battery capacity at a later stage in the battery's life.

Prior art methods of predicting the available reserve time remaining in a discharging battery were based on the assumption that all the battery cells retain their original discharge characteristics. The duration of a discharge to a specified end voltage was essentially predicted from power data-sheet information based on the experimental measured discharge characteristics of a new battery.

One widely used method of predicting the available reserve time of a discharging battery is based on the Peukert parameters, which are based on measured constants that depend on the end voltage of interest of a discharging battery and which are included in an exponential equation. Plotted logrithmically the discharge characteristic of a battery is a straight line with a separate straight line for each end voltage value. Implicit in this method and other prior art methods is the premise that the battery discharge characteristic is fixed and does not vary with the age of the battery. Furthermore the prior art methods assume that the discharge current is a constant value for the entire discharge and do not accommodate varying discharge currents. These discharge prediction methods accordingly permit only rough approximations of the available reserve time of a discharging battery.

In reality the discharge characteristics of the battery cells deviate from their original behavior with age and these initial characteristics are retained for only a few initial charge/discharge cycles. Discharge characteristics also typically deviate substantially from those theoretically predicted by the Peukert relation. Hence it has not been feasible to provide reliable predictions of remaining reserve time for a mature discharging battery.

SUMMARY OF THE INVENTION

A reliable technique of predicting the available reserve time remaining to a selected end voltage of a discharging battery is based on an adaptive state-of-charge algorithm that is active in real time to respond to changing conditions of a battery system. The adaptive state-of-charge algorithm is based on measured discharge characteristics of the battery whose reserve time is to be predicted. These discharge characteristics, according to the invention, have been reduced to two parameters plotted as a single canonical curve invariant to discharge current levels and having a linear and an exponential region. These discharge characteristics defined by the single curve are combined with dynamic parameters of the battery system which are monitored and processed in real time to provide a continuous evaluation and reevaluation of the reserve time remaining under changing conditions. As the battery discharge proceeds there is a continual improvement in the prediction of reserve time available due to the adaptive nature of the prediction.

This predictive feature embodying the principles of the invention is included in a stored program controller for a lead acid battery plant in a central office in the illustrative embodiment of the invention disclosed herein. In such applications it is highly desirable to be able to predict the available reserve time of a discharging battery until a final end voltage level is reached.

BRIEF DESCRIPTION OF THE DRAWING

FIGS. 5-8 are combined.

DETAILED DESCRIPTION

Figure 1:
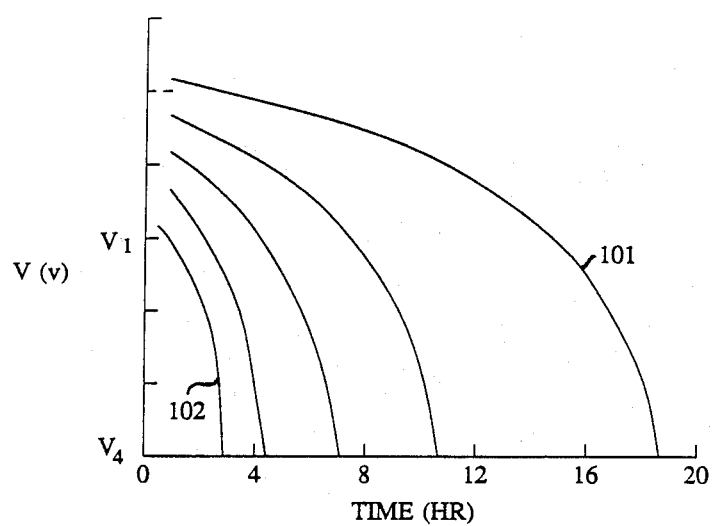
FIG. 1 is a graph of discharge characteristics of a typical battery at varying discharge currents.

The discharge characteristics of a battery at various constant discharge currents are shown in FIG. 1. As shown the battery voltage drops during the discharge process and the time of discharge to a particular voltage level is dependent on the value of the constant discharge current. At a low current as shown by current discharge curve 101 the drop in voltage of the battery is gradual for a substantial time until a first voltage level $V_1$ is attained after which the discharge to a final voltage level $V_4$ is very rapid. As is shown by curve 101 the time duration of discharge is rather long. At a high discharge current as shown by curve 102 the time of discharge until the final voltage $V_4$ is attained is relative short being less than 20% of the discharge time of the current of curve 101. These characteristics can be measured in the laboratory, however they are only accurate for the battery at the stage of its life at which the measurements are made.

These discharge curves can also be expressed analytically in the form of an exponential equation (the Peukert equation) to relate discharge time and current:

$$t_{ev} = a \cdot I(t)^b \tag{1}$$

in which:
$t_{ev}$ = total reserve time to the final voltage level for discharge at current I(t);
I(t) = discharge current at time (t);
a,b = Peukert parameters or constants;

Peukert parameters are determined by experimental measurements made on a discharging battery. Predictive accuracy of the equation (1) is dependent on the measured Peukert parameters which are accurate only for a battery in the life stage in which the parameters were measured.

The discharge behavior of batteries is known to change with the age of the battery and to change during discharge as the discharge current varies. These factors are not taken into account by the prior art discharge time prediction techniques considered above.

Analysis of the many factors related to the discharge characteristics of a discharging battery in accord with the invention permits the discharge time prediction to be based on two defined parameters of the battery. These parameters are $V_p$, the plateau voltage of the battery, and $t^*$ a dimensionless time ratio representing a ratio of battery charge removed to battery charge available at a discharged battery end voltage. The discharge characteristics of a battery defined in terms of those two parameters are illustrated by the single curve 201 shown in FIG. 2 in which the dimensionless time ratio scale of the abcissa is plotted against a logrithmic scale of a difference between the battery plateau voltage and its instantaneous terminal voltage.

As a battery discharges, its terminal voltage fluctuates shortly after the discharge has begun. A temporary initial maximum value is attained and then terminal voltage of the battery begins to decrease. This decrease may have a cyclic nature, but the overall trend is for the battery terminal voltage to decrease in value. For a given battery, this initial maximum value of the terminal voltage consistently occurs at a fixed elapsed time after discharge begins and this voltage magnitude is a fixed value for a given battery. This maximum voltage value is technically known as the plateau voltage $V_p$ and is an important parameter in estimating the reserve time of a discharging battery.

Figure 2:
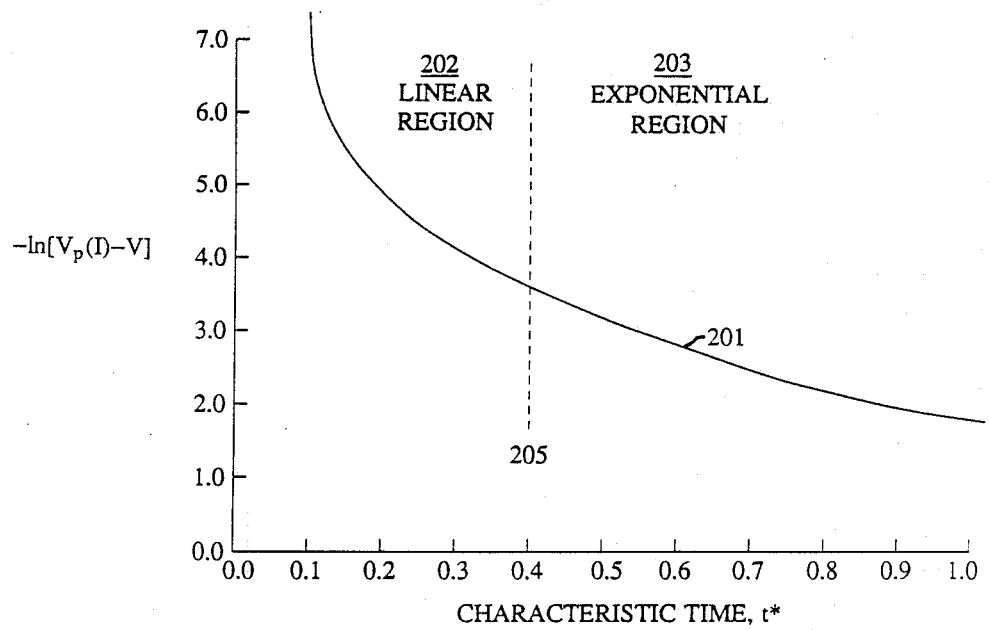
FIG. 2 is a graph of normalized discharge characteristics limited to two variable parameters of the discharge.

This discharge curve 201 in FIG. 2 exhibits a linear portion 202 and an exponential portion 203 with the transition from one to the other at line 205 which in the example has the value 0.4 as the dimensionless time ratio. If the dimensionless time ratio is less than 0.4 the discharge behavior is characterized by a linear portion 202 of the curve 201. When the dimensionless time ratio equals or exceeds 0.4 the discharge behavior is characterized by the exponential portion 203 of the curve 201.

The overall discharge curve 201 is invariant with respect to the magnitude of discharge current within a defined operating range in contrast to the discharge curves of FIG. 1 each of which have a different trajectory for each different magnitude of discharge current. The linear portion 202 of the discharge relationship defined by curve 201 is characterized by the following linear equation:

$$V(t) = V_p(I) - c - d \cdot t^*; \text{for}(t^* < 0.4) \tag{2}$$

and the exponential portion of the discharge relationship defined by curve 201 is characterized by the following exponential equation $$V(t) = V_p(I) - g \cdot \exp(h \cdot t^*); \text{for}(t^* \geq 0.4) \tag{3}$$

where
V(t) = battery terminal voltage at time t
$V_p(I)$ is the battery plateau voltage at a certain discharge
current I as defined by the second degree empirical equation $$V_p(I) = e + f \cdot I + j \cdot I^2 \tag{4}$$

The constants c, d, e, f, g, h and j of equations (2), (3) and (4) are determined by experimentally discharging a battery of the type to be monitored, graphing its discharge characteristics corresponding to the equations (2), (3) and (4) and obtaining the values of the constants from the plotted graphs. Here c, d, g and h are measured constants of the battery which are independent of the battery discharge current and end voltage; c, d and g are measured in volts and h is dimensionless. e, f and j are also battery constants independent of battery discharge current and end voltage. Here e is measured in volts and represents the plateau voltage, f is measured in ohms and j is measured in terms of ohms/ampere.

The dimensionless time ratio $t^*$ discussed above with reference to FIG. 2, is represented by:

$$t^* = \frac{q_t}{q_d} \tag{5}$$

Where
$q_t$ is the battery charge removed at time t and
$q_d$ is the battery charge available to the default end discharge voltage.

Figure 3:
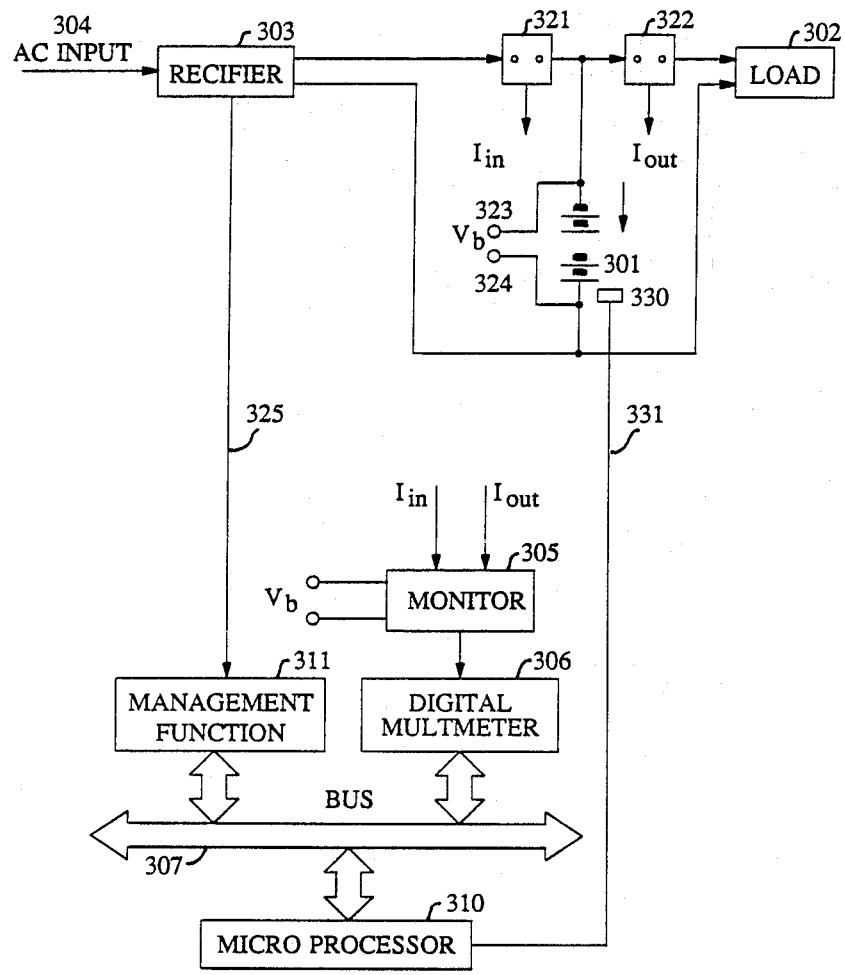
FIG. 3 is a schematic of a battery system including apparatus operable according to the invention to predict a remaining reserve time of discharge for a battery to a final specified end voltage.

A typical illustrative battery system arrangement in which it is desirable to predict the remaining discharge reserve time of a discharging battery is shown in FIG. 3, which discloses a simple battery plant arrangement. This battery plant arrangement may include a lead acid battery although it is to be understood that the invention is not limited to this type of battery. A battery 301 is connected for energizing a load 302 and is continuously recharged by a rectifier 303 connected to a commercial AC line power input 304. Operation performance and status of the battery is monitored by a monitoring circuit 305 which is connected to current sensing shunts 321 and 322 and terminals 323 and 324 to determine the battery input charging current, the battery output current and the battery terminal voltage, respectively. While a monitoring of the whole battery is shown in FIG. 3, it is to be understood that in actual application individual battery cell voltages and other subassemblies may be specifically monitored. The monitored signal variables are applied to a digital multimeter 306 which in turn is connected to a data bus 307.

A microprocessor controller 310 including a stored program control for the battery plant is also connected to the bus. It continuously analyzes data acquired by the digital multimeter 306 and controls the management of the battery plant through the management function control unit 311 which is connected via lead 325 to control functioning of the rectifier and other subassemblies and switches of the plant. Temperature of the battery 301 is sensed by a thermo sensing device 330 whose output is connected directly to the microprocessor controller 310, via lead 331.

Figure 4:
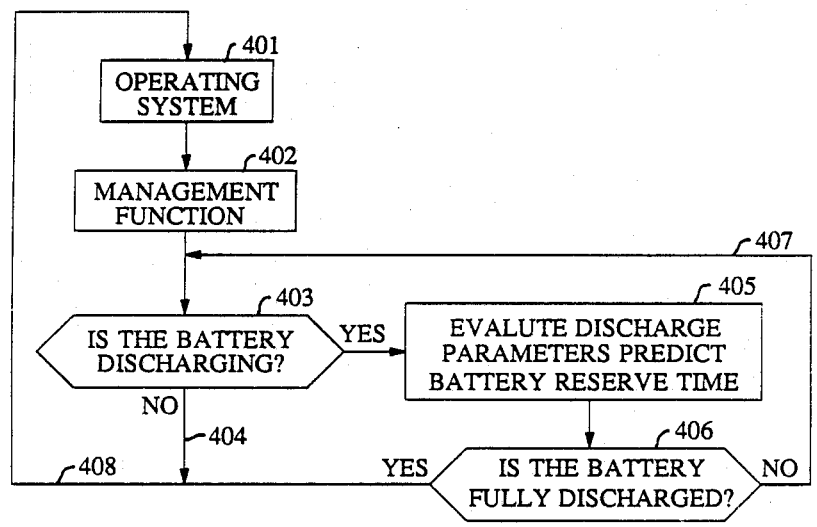
FIG. 4 is a flow diagram of a stored program for managing the battery system of FIG. 1 including detecting and predicting the remaining reserve time of a discharging battery.
Figure 9:
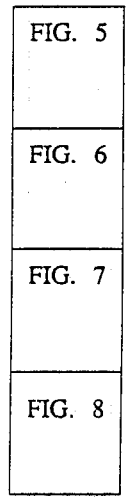
FIG. 9 shows how
Figure 5:
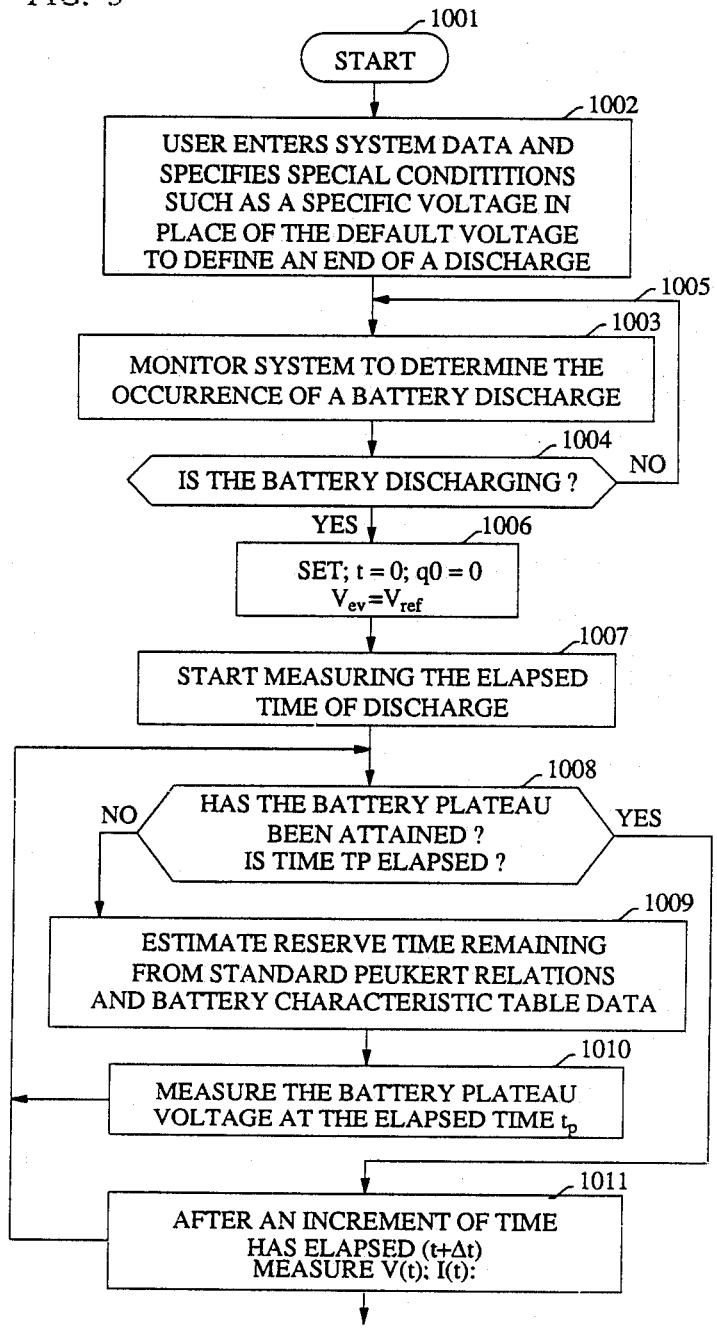
FIG. 5-8 contain a flow diagram of the reserve time prediction portion of the operating control system of FIG. 4.
Figure 6:
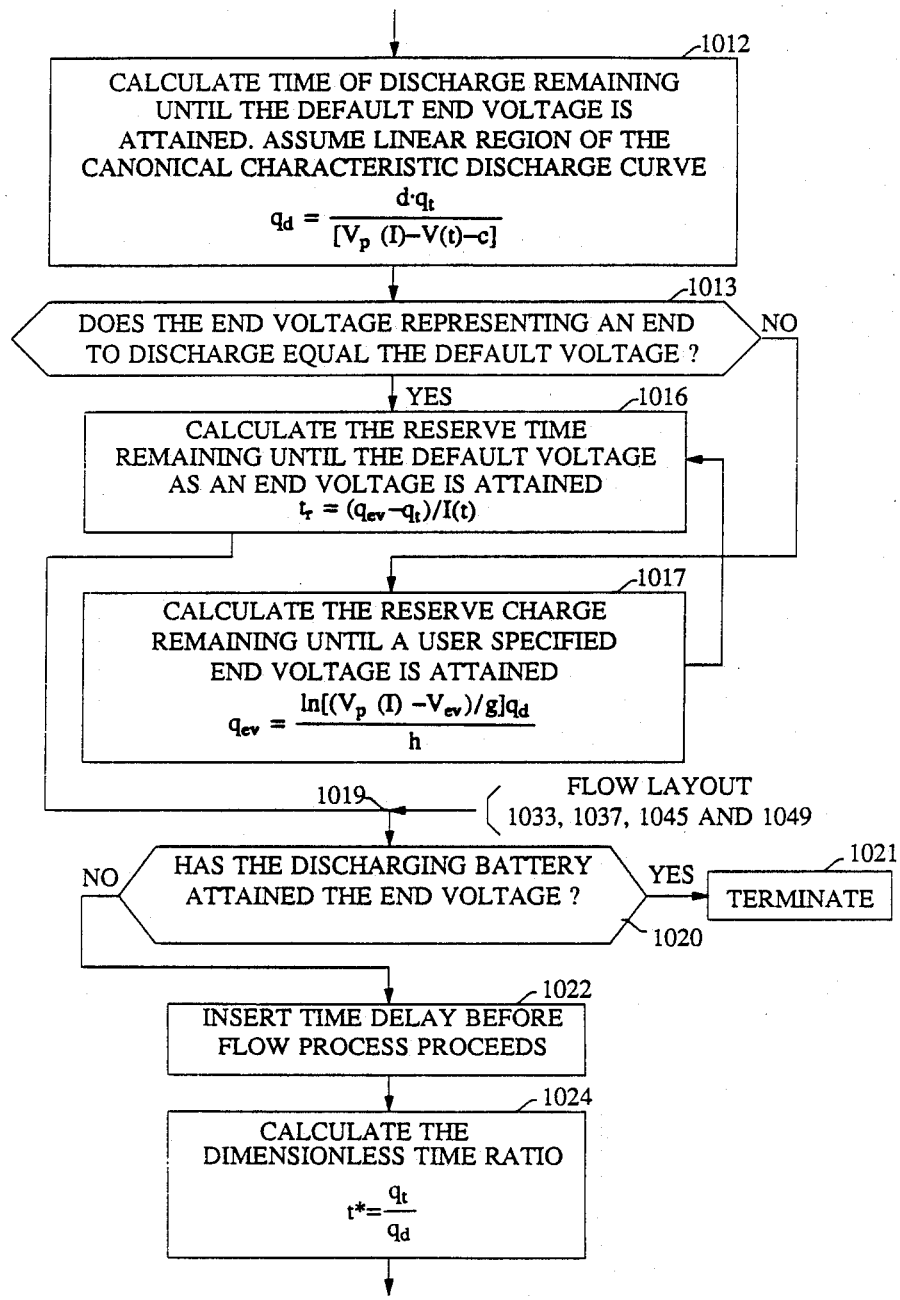
Figure 7:
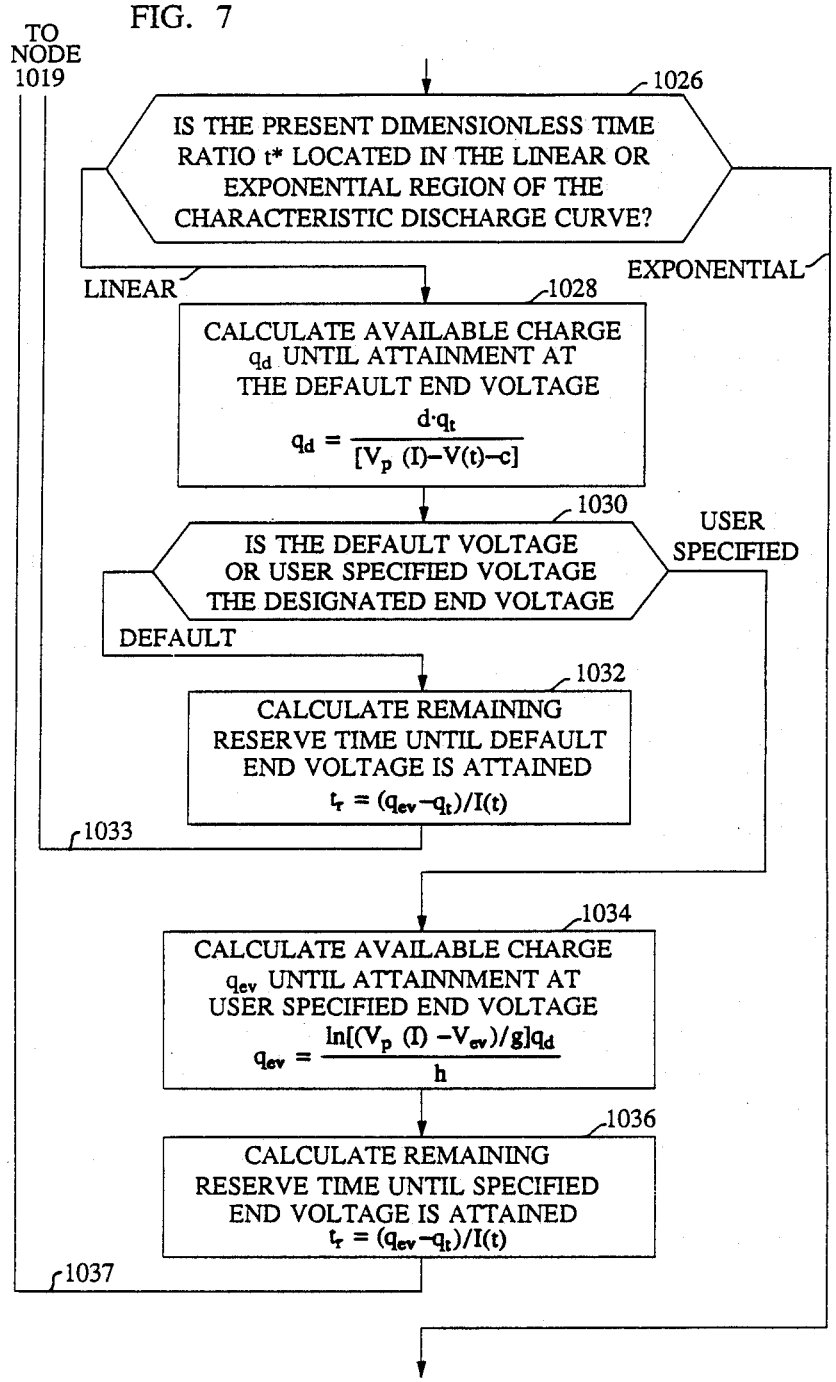
Figure 8:
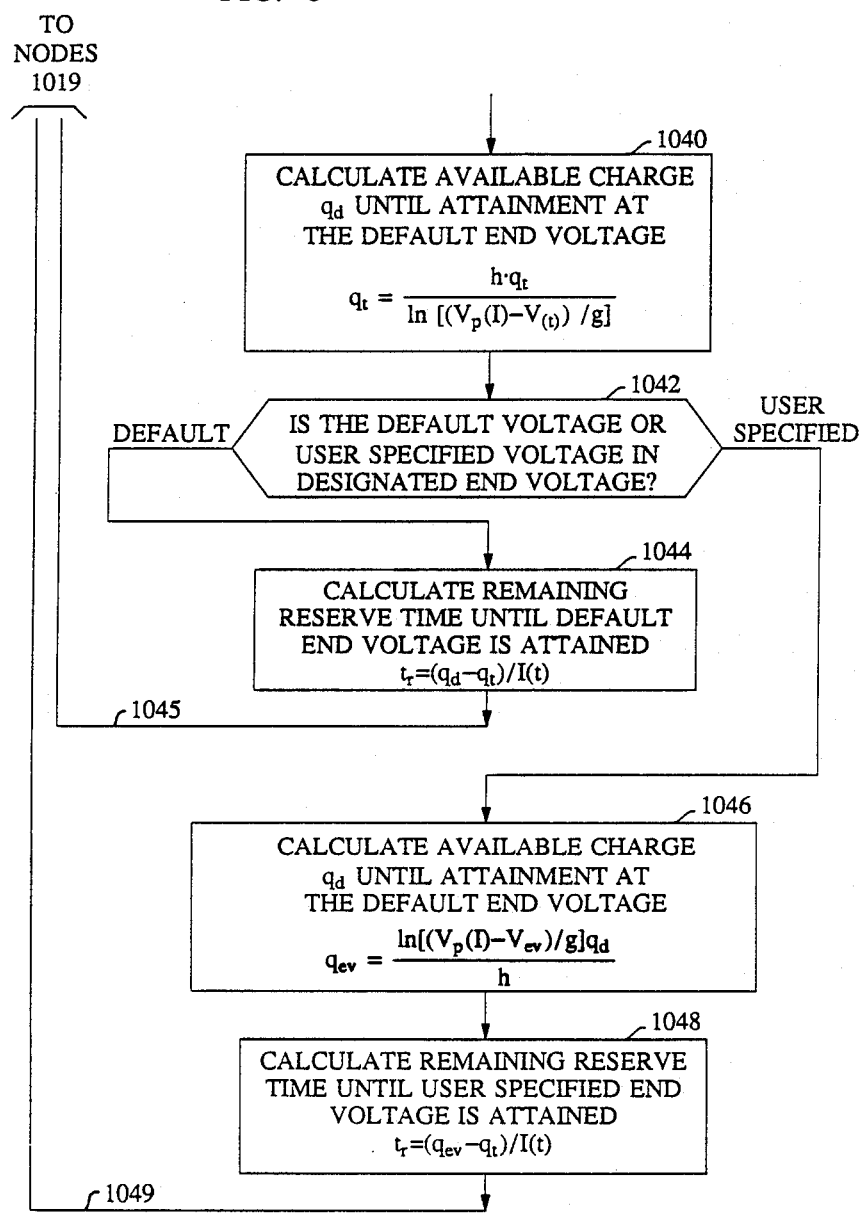

The stored program of the microprocessor control 310 includes an operating system 401 such as shown in the flow chart of FIG. 4 and further includes a stored program management function 402. It periodically loops through the management function 402 and periodically checks to determine if the battery is discharging in a decision function 403 which queries—is the battery discharging? If no battery discharge activity is occurring, the normal management function loop continues, via flow line 404, to return to the operating system function 401. If occurrence of a battery discharge is detected through evaluation of the data supplied by the digital multimeter 306, the discharge parameters are periodically evaluated by the stored program during the interval of discharge in function block 405 in order to determine the reserve time remaining until the battery voltage attains some specified final end voltage value. The end voltage value may be some pre-specified default value contained in the stored program or it may be another value presently specified by the user of the management system.

The stored program includes stored data that reflects the canonical battery discharge characteristics as shown in the graph of FIG. 2. A predictive operation to calculate a reserve time is performed in the function block 405 and a reserve time value is calculated representing a reserve time remaining from the present instant until the battery voltage attains the default or specified end voltage value. It is determined in subsequent decision block 406 if the battery has fully discharged; (i.e., has the default or specified end voltage been attained)? If the battery is still discharging and its voltage is greater than the end voltage, the process proceeds by flow line 407 to the decision block 403 and from there to a subsequent prediction evaluation of reserve time in function block 405. If the battery has fully discharged in that its terminal voltage is equal to the default or specified end voltage, the process returns by flow line 408 to the operating system function 401 and the periodic prediction of discharge reserve time remaining is terminated.

The predictive technique embodied in the blocks 405 and 406 in FIG. 4 is shown in detail in the flow chart shown in FIGS. 5-8. This flow chart shows in detail the portion of the stored program concerned with predicting the reserve time remaining until a discharging battery attains an end voltage value.

The battery predictive technique for predicting available reserve time of a battery begins at the start terminal 1001 which is activated by turning on the management system and proceeds to the function block 1002 which allows the battery plant user to specify status and operating parameters of the battery system. Such information specifically includes an end voltage at which the battery is considered to be fully discharged, and certain measured parameters or constants of the battery as indicated above and also data as to the past charging and discharging history of the battery. The system architecture and other physical characteristics of the battery such as cell voltage and cell storing values and various plant parameters are additionally specified.

The prediction evaluation technique includes instructions in function block 1003 to monitor the battery operation state for variables that are related to charging and discharging of the battery. A determination is made in subsequent decision function 1004 as to whether a battery discharge condition has occurred. If there is no existing battery discharge the control flow returns, via flow line 1005, to continue to monitor the battery condition. If the occurrence of a battery discharge is detected the control flow continues to function block 1006 in which a time variable t representing elapsed time of discharge is set to zero and a discharge variable q defining discharge in accumulated ampere hours is set to zero. The end voltage at which discharge is considered complete, has also been specified as either the default voltage $V_d$ or a user specified end voltage $V_{ev}$ and is set as the voltage at which a discharge is considered complete.

The stored program control begins measuring the elapsed time of discharge in the function block 1007. This is a running time of discharge and is utilized in subsequent calculations during discharge to determine a remaining battery reserve time to a particular end voltage.

Subsequent decision block 1008 measures the elapsed time to ascertain if the discharging battery has attained its plateau voltage value. In the initial moments after discharge the battery voltage for any particular battery increases in value and attains a maxima voltage value after a short but definite interval of discharge. The plateau voltage of a discharging battery is this maxima of voltage that occurs at a specific elapsed time after a discharge of the battery has begun. Its specific value is a function of the discharge current and other battery characteristics. In the illustrative example the plateau voltage $V_p$ occurs at 14 elapsed minutes after the discharge of the battery has begun.

If the battery has not attained its plateau voltage value, the process proceeds to function block 1009 where standard Peukert equations are utilized to predict the reserve time remaining until an end voltage is attained. This standard Peukert equation is typically expressed as equation (1) with modifications to accommodate the measured battery operating temperature where the total discharge time $t_{ev}$ is defined as $$t_{ev} = a \cdot I(t)^b \cdot [1 + 0.005 \cdot (T - 77)] \qquad (6)$$

where
T is temperature °F.
a and b are the measured Peukert factors; and
I(t) is the present discharge current.
By evaluating this equation, the stored program can determine the remaining reserve time $t_r$ for the battery to reach the end voltage. This remaining reserve time $t_r$ is estimated by equation $$t_r = t_{ev} - \frac{q_t}{I(t)} \qquad (7)$$

where I(t) is the discharge current, and $q_t$ is the amount of charge (ampere hours) removed from the battery by the elapsed time t and which in turn is expressed as:

$$q_t = \int_0^t I(t) dt \qquad (8)$$

If enough time has elapsed for the discharging battery to attain its plateau voltage; its plateau voltage and discharge current is or has been measured in response to a command in function block 1010 which measurement takes place at the time $t_p$. The value of the constant e which is related to the plateau voltage is also determined.

After a predetermined time delay the control flow proceeds to the function block 1011 where the present battery voltage V(t) and discharge current I(t) is measured and these values are stored in memory. A preliminary calculation of the batteries overall reserve time of discharge to attainment of the default voltage is calculated by calculating available battery charge at the default end voltage in function block 1012 according to the equation $$q_d = \frac{d \cdot q_t}{[V_p(I) - V(t) - c]} \qquad (9)$$

where $q_d$ is the total battery charge available to the default end voltage $V_p(I)$ is the measured plateau voltage for the present discharge current V(t) is the present battery voltage and c is a measured battery constant expressed in voltage This equation (9) assumes that the discharge characteristic of the battery is at this time within the linear region 202 of the curve 201 in FIG. 2 and assumes the standard default voltage in estimating the discharge reserve time.

The control flow now inquires in decision block 1013 if the end voltage at which the discharge is considered complete is the default voltage or if a user specified end voltage has been entered. If the default voltage, specified by the system, is the voltage of interest as an end voltage the time remaining to attainment of that voltage is calculated in process block 1016 by the formula $$t_r = (q_{ev} - q_t)/I(t) \qquad (10)$$

where t is the elapsed time $q_{ev}$ is the total charge available until the default end voltage is attained $t_r$ is the time remaining until the end voltage will be attained If, on the other hand, the user has specified an end voltage in place of the default voltage the total discharge time for that specified end voltage is calculated in process block 1017 by equation $$q_{ev} = \frac{\ln[(V_p(I) - V_{ev})/g]}{h} q_d \qquad (11)$$

where g and h are measured constants $q_d$ is the charge available to the default voltage The flow then proceeds from function block 1017 to function block 1016 wherein the time remaining until the final discharge end voltage is calculated by equation (10).

Determination of the instantaneous battery voltage is made in decision block 1020 to determine if the end voltage value of discharge has been attained. If the end voltage value has been attained the control flow proceeds to the termination terminal 1021 where a state of discharge is declared and the attainment of the end voltage may be alarmed or the load may be disconnected. If the end voltage is not attained a time delay interval is instituted in subsequent function block 1022 and the prediction system continues to recalculate a discharge reserve time after expiration of this time delay.

At the next time increment a new dimensionless time ratio is calculated in function block 1024 as per equation (5). This calculation based on a history of the discharge determines a ratio of the discharge ampere hours already expended $q_t$ with the total ampere hours $q_d$ which will be removed at the time the default end voltage of discharge is achieved.

The newly calculated dimensionless time ratio is reviewed in decision block 1026 to determine if present discharge characteristic is operating within a linear region 202 or an exponential region 203 of the discharge characteristic curve 201 graphed in FIG. 2.

If it is determined in decision function 1026 that the present discharge characteristic is operating in the linear region, the process flow proceeds to the function block 1028 in which the charge $q_d$ available until the attainment of the default voltage is calculated by solving the equation (9). Subsequent decision function 1030 ascertains if the default voltage or a user specified voltage is the end voltage at which the battery discharge is supposed to be complete.

If the default voltage of the system is the designated end voltage at which discharge of the battery is considered complete the remaining discharge reserve time to the end voltage is calculated in function block 1032 by applying $q_d$ to equation (10) as detailed in function block 1032. Control flow then proceeds to node 1019 via flow line 1033.

If the user has specified an end voltage other than the default voltage the available charge $q_{ev}$ until the attainment of the specified end voltage is calculated in function block 1034 by using equation (11) in which the value $q_d$ is an input as a variable. The actual reserve time remaining until the end voltage is determined in function block 1036 using the equation (10). The control flow then returns, via flow line 1037, to node 1019.

If the present discharge characteristic is operating in the exponential region as determined in decision block 1026 the process proceeds to function block 1040 in which the available charge $q_d$ until the attainment of the default voltage is calculated by solving the following equation.

$$q_d = \frac{h \cdot q_t}{\ln[(V_p(I) - V_{(t)})/g]} \qquad (12)$$

Decision function 1042 determines if the default voltage or a user specified voltage has been selected as the end voltage at which the battery discharge is considered complete.

If the default voltage of the system is the designated end voltage at which discharge of the battery is considered complete the remaining reserve time to the end voltage is calculated by applying $q_d$ to equation (10) as detailed in function block 1044. The control flow then returns, via flow line 1045, to node 1019. If an end voltage other than the default voltage is specified the available charge $q_{ev}$, until the attainment of the specified end voltage, is calculated in function block 1046 by using equation (11). The actual reserve time remaining until the end voltage is determined in function block 1048 using the equation (10).

At the end of each determination of the remaining reserve time for both the linear region and the exponential region the flow process returns to node 1019. The calculation of this battery discharge reserve time is continuously recycled until the end voltage indication of completion of the discharge is attained.

We claim:

1. A method of predicting the time remaining of a battery discharge until an end voltage is attained; comprising the steps of
characterizing the discharge behavior of a discharging battery with a discharge curve having a locus invariant with respect to a magnitude of the discharge current and being variant with respect to a fraction of available charge to an end voltage charge and to a function of a difference between a plateau voltage and a present voltage of the discharging battery,
measuring the plateau voltage of the discharging battery,
measuring a present voltage of the discharging battery to locate a point on the discharge curve,
using the discharge curve for determining the fraction of available charge to an end voltage charge and expressing the fraction as a dimensionless time ratio,
converting the dimensionless time ratio to a time remaining until the discharging battery reaches a selected end voltage.

2. A method of predicting the time remaining of a battery discharge until an end voltage is attained, as claimed in claim 1 wherein the discharge curve is characterized with a linear region at low values of the fraction of available charge and with an exponential region at higher values of the fraction of available charge up to and including unity.

3. A method of predicting the time remaining of a battery discharge until an end voltage is attained, as claimed in claim 2 wherein the dimensionless time ratio is evaluated to determine if discharge is occurring within a linear region of the discharge curve and calculating time of discharge remaining until an end voltage is attained based on linear characteristics of the discharge curve.

4. A method of predicting the time remaining of a battery discharge until an end voltage is attained, as claimed in claim 2 wherein the dimensionless time ratio is evaluated to determine if discharge is occurring within an exponential region of the discharge curve and calculating time of discharge remaining until an end voltage is attained based on exponential characteristics of the discharge curve.

5. A method of predicting the time remaining of a battery discharge until an end voltage is attained as claimed in claims 3 or 4 wherein the steps of measuring a present voltage and determining the fraction and converting the dimensionless time ratio are performed at successive incremental time intervals until the end voltage is attained.

6. A method of predicting the time remaining of a battery discharge until an end voltage is attained, as claimed in claim 5 wherein characterizing the discharge behavior includes dimensional analysis of battery discharge characteristics for eliminating discharge currents as a variable.

7. Apparatus for predicting a reserve time for a battery discharge within a battery plant system until an end voltage is attained, comprising:
a stored program controller including;
stored data elements characterizing a discharge behavior of a battery connected to the battery plant system in terms of a battery voltage and its plateau voltage and a fraction of available charge to charge at an end voltage and further being invariant with respect to a discharge current magnitude;
voltage measuring apparatus under control of the extent program controls and connected for measuring a voltage of this battery,
current measuring apparatus under control of the stored program controller and connected for measuring a discharge current of the battery,
the stored program controller further including instructions for initially determining a plateau voltage of the battery and ascertaining a battery voltage and discharge current at incremental time intervals, and processing measured voltage and current in order to determine through used the stored data elements a time ratio as a fraction of available charge to charge at an end voltage and converting the time ratio to a reserve time remaining for a battery discharge until an end voltage is attained.

8. Apparatus for predicting a reserve time remaining for a battery discharge with a battery plant system until an end voltage is attained as claimed in claim 7 wherein the stored program controller includes stored data elements which characterize a discharge behavior of a battery into a linear characteristic at low value of the time ratio and an exponential characteristic at higher value of the time ratio.

9. Apparatus for predicting a reserve time remaining for a battery discharge with a battery plant system until an end voltage is attained as claimed in claim 8, wherein the stored program controller includes instructions to determine if a present discharge is occurring with a specific one at the linear and exponential region of the discharge characteristic by evaluating the time ratio.

10. A method for adaptively predicting a reserve time remaining to a discharging battery until a specified end voltage is achieved, comprising the steps of:
selecting a standard end voltage of the discharged battery at some acceptable voltage value;
characterizing a discharge for the battery into a single discharge characteristic curve functionally relating a voltage difference between a battery plateau voltage and a present terminal voltage and a dimensionless time variable and the single discharge characteristic curve having a linear region and an exponential region determined by the immediate value of the dimensionless time variable;
detecting the occurrence of a discharge current from the battery;
measuring a plateau voltage of the battery at an appropriate time into the discharge occurrence;
measuring a terminal voltage at the battery and a discharge current of the battery initially calculating a total time of discharge for the battery to the standard end voltage utilizing the plateau voltage and dimensionless time variable and first assuming a battery discharge in the linear region of the curve;
calculating a reserve time remaining from the present time to the standard end voltage; and
periodically again determining a reserve time by evaluating the dimensionless time constant after a time increment by comparing the present time to the time of discharge calculated;

determining if the dimensionless time constant is in the linear region;

calculating a total discharge time based on the region in which the dimensionless time constant occurs; and calculating reserve time remaining to the discharging battery from the present time until the standard end voltage;

continuing periodic evaluation of reserve time until the battery attains its end voltage.

11. A method for adaptively predicting a reserve time remaining to a discharging battery as claimed in claim 10, and further comprising the step of calculating a reserve time to a selected end voltage other than the standard end voltage by calculating a reserve time remaining to a standard end voltage and multiplying reserve time to standard end voltage by a ratio of available charge to charge at the end voltage.

12. A method for adaptively predicting a reserve time remaining to a discharging battery as claimed in claim 11 and further comprising the step of:

modifying the plateau voltage by a constant unique to the battery characteristic monitored to improve accuracy of prediction of reserve time.

13. A method for adaptively predicting a reserve time remaining to a discharging battery as claimed in claim 12 and further comprising the step of:

calculating reserve time prior to occurrence of the plateau voltage by using standardized battery discharge data.

14. Apparatus for adaptively predicting a reserve time remaining to a discharging battery until a end voltage is achieved, comprising:

detection apparatus for detecting an occurrence of a battery discharge;

measuring apparatus for measuring a battery plateau voltage at an appropriate time after a battery discharge is initiated, and periodically measuring a battery terminal voltage and a battery discharge current;

a stored program apparatus including data characterizing a discharge of the battery to a standard end voltage into a single discharge characteristic independent of the discharge current magnitude, and as a function of a difference between a battery terminal voltage and its plateau voltage and a fraction of available charge remaining in the battery; and further including stored instructions for:

initially calculating a time for a discharging battery to achieve the standard end voltage and subsequently calculating a reserve time from the present time to the end voltage, and periodically recalculating a reserve time to the end voltage until the end voltage is achieved.

15. Apparatus for adaptively predicting a reserve time remaining to a discharging battery until a specified end voltage is achieved, as defined in claim 14 and further comprising:

data defining a discharge curve in terms of a linear region and a subsequent exponential region, and additional stored instructions for calculating a reserve time in the linear region and in the exponential region.

16. A method for adaptively predicting a reserve time remaining to a discharging sealed lead acid battery until a specified end voltage is attained, comprising the steps of:

A: specifying an end voltage for the battery at which discharge is considered nominally completed, B: determining a plateau voltage at which adaptive prediction of discharge begins, C: characterizing battery discharge with a canonical discharge function relating a difference between a plateau voltage of the battery and its present terminal voltage to a present state of charge of the battery to a final charge of the battery at completion of discharge and the discharge function having an intial linear characteristic followed by a subsequent exponential characteristic, D: monitoring a terminal voltage of the battery to determine the initial occurrence of a discharge, E: marking an occurrence of a plateau voltage during discharge of the battery and continuously measuring elapsed time of discharge after its occurrence, F: initially estimating discharge time remaining until a specified end voltage is attained by calculating a quantity of battery charge available to attainment of the discharge voltage with the equation, $$q_d = \frac{d \cdot q_t}{[V_p(I) - V(t) - c]}$$

G: calculating the reserve time remaining with the equation, $$t_r = (q_{ev} - q_t)/I(t)$$

H: terminating calculation of reserve time if the battery voltage has attained the specified end voltage value, I: calculating a dimensionless time ratio with the equation, $$t^* = \frac{q_t}{q_d}$$

J: evaluating the dimensionless time ratio to determine the present operating locus within one of the linear and exponential characteristics, K: again estimating discharge time remaining until a default end voltage is attained by calculating a quantity of battery charge remaining with a calculation appropriate to the present operating locus, L: performing calculations in the linear characteristic with the equation, $$q_d = \frac{d \cdot q_t}{[V_p(I) - V(t) - c]}$$

M: calculating the reserve time remaining until the specified end voltage is attained with the equation, $$t_r = (q_{ev} - q_t)/I(t)$$

N: performing calculations in the exponential characteristic with the equation, $$q_d = \frac{h \cdot q_t}{\ln[(V_p(I) - V(t))/g]}$$

O: calculating the reserve time remaining until the specified end voltage is attained with the equation, $$t_r = (q_{ev} - q_t)/I(t)$$

P: continuously monitoring a voltage of the battery and iteratively repeating steps [I] through [O] until the specified end voltage is reached.

17. A method for adaptively predicting a reserve time remaining to a discharging sealed lead acid battery until a specified end voltage is attained, as claimed in claim 16;
    including the added steps of:
    Q: selecting an end voltage other than the specified end voltage as representing a completion of a discharge of the battery,
    R: within the linear characteristic and subsequent to step [L] calculating an available charge remaining until the end voltage other than the specified end voltage is attained with the equation, $$q_{ev} = \frac{\ln[(V_p(I) - V_{ev})/g]}{h} q_d$$

S: repeat step [M] and go to step [P],

T: within the exponential characteristic and subsequent to step [N] calculating an available charge remaining until the end voltage other than the specified end voltage is attained with the equation, $$q_{ev} = \frac{\ln[(V_p(I) - V_{ev})/g]}{h} q_d$$

U: repeat step [O] and go to step [P].

18. A method for adaptively predicting a reserve time remaining to a discharging sealed lead acid battery until a specified end voltage is attained, as claimed in claim 16;
    including the added step of:
    V: inserting an incremental time delay prior to each performance of the steps [L] through [P].

19. A method for adaptively predicting a reserve time remaining to a discharging sealed lead acid battery until a specified end voltage is attained, as claimed in claim 16;
    including the added step of:
    measuring discharge characteristics of the battery to obtain constants c, d and g of the equations.

* * * * *